United States Patent
Li

(10) Patent No.: US 7,113,812 B2
(45) Date of Patent: Sep. 26, 2006

(54) ROTATABLE WIRELESS TRANSCEIVER DEVICE

(75) Inventor: Hsi-Wei Li, Ta-Li (TW)

(73) Assignee: Universal Scientific Industrial Co., LTD, (TW)

(*) Notice: Subject to any disclaimer, the term of this patent is extended or adjusted under 35 U.S.C. 154(b) by 158 days.

(21) Appl. No.: 10/995,615

(22) Filed: Nov. 23, 2004

(65) Prior Publication Data

US 2006/0111157 A1 May 25, 2006

(51) Int. Cl.
*H04M 1/00* (2006.01)

(52) U.S. Cl. .................................. 455/575.1; 455/90.1

(58) Field of Classification Search .. 455/575.1–575.5, 455/90.1–90.3; 361/680, 683; 705/27
See application file for complete search history.

(56) References Cited

U.S. PATENT DOCUMENTS

| | | | |
|---|---|---|---|
| 2004/0070924 A1* | 4/2004 | Wu | 361/680 |
| 2005/0002158 A1* | 1/2005 | Olodort et al. | 361/683 |
| 2005/0090296 A1* | 4/2005 | Gordecki | 455/575.3 |
| 2005/0111172 A1* | 5/2005 | Wang | 361/680 |
| 2005/0137942 A1* | 6/2005 | LaFleur | 705/27 |
| 2006/0044747 A1* | 3/2006 | Chen | 361/683 |

* cited by examiner

*Primary Examiner*—Duc Nguyen
*Assistant Examiner*—Michael Vu
(74) *Attorney, Agent, or Firm*—Ostrolenk, Faber, Gerb & Soffen, LLP

(57) ABSTRACT

In a wireless transceiver device, a connector module has a coupling section with a first pivot part extending along a first pivot axis. A coupling base is formed with a first pivot hole that engages rotatably the first pivot part to permit relative rotation between the coupling base and the connector module about the first pivot axis, and a pair of second pivot holes aligned along a second pivot axis. A wireless transceiver module includes a casing formed with a pair of third pivot holes corresponding respectively to the second pivot holes, and a wire unit to connect electrically the wireless transceiver module to the connector module. The wire unit includes a pair of second pivot parts pivotally retained at aligned pairs of the second and third pivot holes to permit relative rotation between the wireless transceiver module and the coupling base about the second pivot axis.

7 Claims, 10 Drawing Sheets

ROTATABLE WIRELESS TRANSCEIVER DEVICE

BACKGROUND OF THE INVENTION

1. Field of the Invention

The invention relates to a wireless transceiver device, more particularly to a rotatable wireless transceiver device that can facilitate mass production and that can prolong the service life of electrical wires therein.

2. Description of the Related Art

In a wireless local area network (WLAN), data can be accessed over the network through a plurality of WLAN access points. Users are permitted to download or upload data from and to the WLAN through the WLAN access points by installing a WLAN card into a host computer that is connected to the WLAN.

As shown in FIGS. 1 and 2, a conventional wireless transceiver device 2 for WLAN applications is adapted to be connected to a socket 11 of a host computer 1, and includes a hollow coupling base 21, a connector module 22, a pivot module 23, a wireless transceiver module 24, and a cover 25 for covering the connector module 22.

The coupling base 21 includes first and second shell portions 211, 212 that are coupled together, and has opposite first and second end parts 213, 214. The second end part 214 is formed with a notched section 215, and a pair of first pivot holes 216 in opposite sides of the notched section 215.

The connector module 22, such as a universal serial bus (USB) connector module, has a connecting section 222 for connecting with the socket 11 of the host computer 1, and a coupling section 221 opposite to the connecting section 222 for coupling immovably with the coupling base 21.

The pivot module 23 includes first and second casing parts 231, 232 that are coupled together, and has a first pivot tube 233, and a second pivot tube 234 that extends transversely and outwardly from the first pivot tube 233. The first pivot tube 233 is disposed in the notched section 215, and has opposite first and second tube ends 2331, 2332 that engage rotatably and respectively the first pivot holes 216 of the coupling base 21. The second pivot tube 234 has a third tube end 2341.

The wireless transceiver module 24 includes a casing 241 and a transceiver circuit 242 disposed in the casing 241. The casing 241 is formed with a second pivot hole 2411 to engage rotatably the third tube end 2341 of the second pivot tube 234 of the pivot module 23. The transceiver circuit 242 includes a plurality of flexible wires 2421 that extend through the pivot module 23 and that are connected electrically to the connector module 22. The transceiver circuit 242 is thus able to transmit and receive data to and from the host computer 1.

In view of the above construction, the pivot module 23 is permitted to rotate in the notched section 215 of the coupling base 21 about the first pivot tube 233, as best shown in FIG. 3, thereby permitting movement of the wireless transceiver module 24 relative to the connector module 22 about a first pivot axis within a 180-degree range. Furthermore, as shown in FIG. 4, the casing 241 of the wireless transceiver module 24 is permitted to rotate about a second pivot axis, i.e., about the second pivot tube 234 of the pivot module 23, relative to the connector module 22. In order to avoid undesired excessive twisting of the wires 2421, the casing 241 is formed with a first limit member 2412 (see FIG. 2) proximate to the second pivot hole 2411, and the third tube end 2341 of the second pivot tube 234 is formed with a second limit member 2342 (see FIG. 2) that cooperates with the first limit member 2412 for limiting the extent of relative rotation between the wireless transceiver module 24 and the pivot module 23 within a 270-degree range.

While the aforesaid wireless transceiver device 2 permits adjustment of the wireless transceiver module 24 relative to the connector module 22 about two pivot axes for optimum signal transmission, aside from forming the shell portions 211, 212 of the coupling base 21, mass production of the wireless transceiver device 2 involves a separate step of assembling the coupling base 21 onto the connector module 22 and the pivot module 23, which ties up production time and which is inconvenient to conduct. In addition, the wires 2421 can come into direct contact with the pivot module 23 during adjustment of the wireless transceiver module 24 such that the wires 2421 are subjected to friction forces during adjustment of the wireless transceiver module 24, which results in a relatively short service life for the wires 2421.

SUMMARY OF THE INVENTION

Therefore, an object of the present invention is to provide a rotatable wireless transceiver device that can facilitate mass production.

Another object of the present invention is to provide a rotatable wireless transceiver device that includes anti-friction members to help prolong the service life of electrical wires therein.

Accordingly, a rotatable wireless transceiver device of the present invention comprises a connector module, a hollow coupling base, and a wireless transceiver module.

The connector module has a connecting section that is provided with electrical connector means adapted for connecting electrically with an external electronic device, and a coupling section that is opposite to the connecting section in a first direction and that is formed with a first pivot part extending along a first pivot axis parallel to the first direction and away from the connecting section. The first pivot part is formed with a first limit member.

The coupling base has a first end part formed with a first pivot hole that extends in the first direction and that engages rotatably the first pivot part to permit relative rotation between the coupling base and the connector module about the first pivot axis. The coupling base further has a second end part formed with a pair of second pivot holes that are spaced apart from the first pivot hole in the first direction and that are aligned in a second direction transverse to the first direction. The coupling base further has a second limit member that cooperates with the first limit member to limit extent of relative rotation between the coupling base and the connector module about the first pivot axis.

The wireless transceiver module includes a casing, a transceiver circuit, and a wire unit. The casing is formed with a notched section to receive the second end part of the coupling base. The notched section is formed with a pair of third pivot holes, each of which is aligned with a respective one of the second pivot holes. The transceiver circuit is disposed in the casing. The wire unit includes a plurality of flexible wires, each of which has a first end that is connected electrically to the transceiver circuit, and a second end that extends out of the casing at one of the third pivot holes, that extends through one of the second pivot holes and through the first pivot hole of the coupling base, and that is connected electrically to the connector module. The wire unit further includes a pair of second pivot parts, each of which is pivotally retained at a respective aligned pair of the second and third pivot holes and permits extension of a corresponding set of the flexible wires therethrough, thereby permitting relative rotation between the wireless transceiver module and the coupling base about a second pivot axis transverse to the first pivot axis and parallel to the second direction.

Preferably, the first pivot part is formed as an injection-molded sheath that encapsulates the coupling section of the connector module. The first pivot part further includes an anti-friction member in the sheath. The anti-friction member permits the second ends of the flexible wires of the wire unit to extend therethrough, and prevents direct contact between the sheath and the flexible wires of the wire unit.

Preferably, each of the second pivot parts includes a pair of anti-friction members that permit extension of the corresponding set of the flexible wires therethrough, and a sheath that encloses the anti-friction members.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
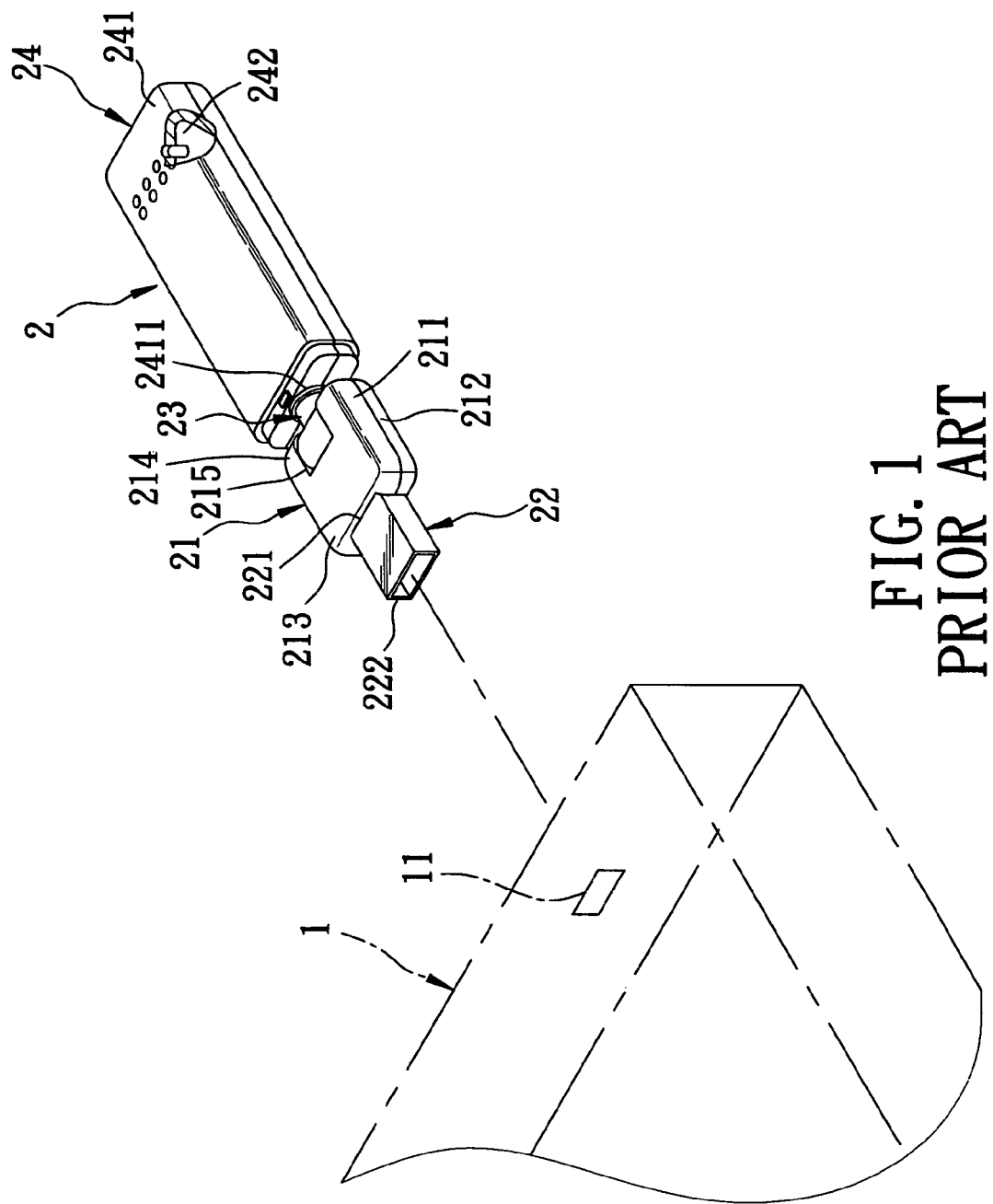
FIG. 1 is an assembled perspective view of a conventional wireless transceiver device for a host computer.
Figure 2:
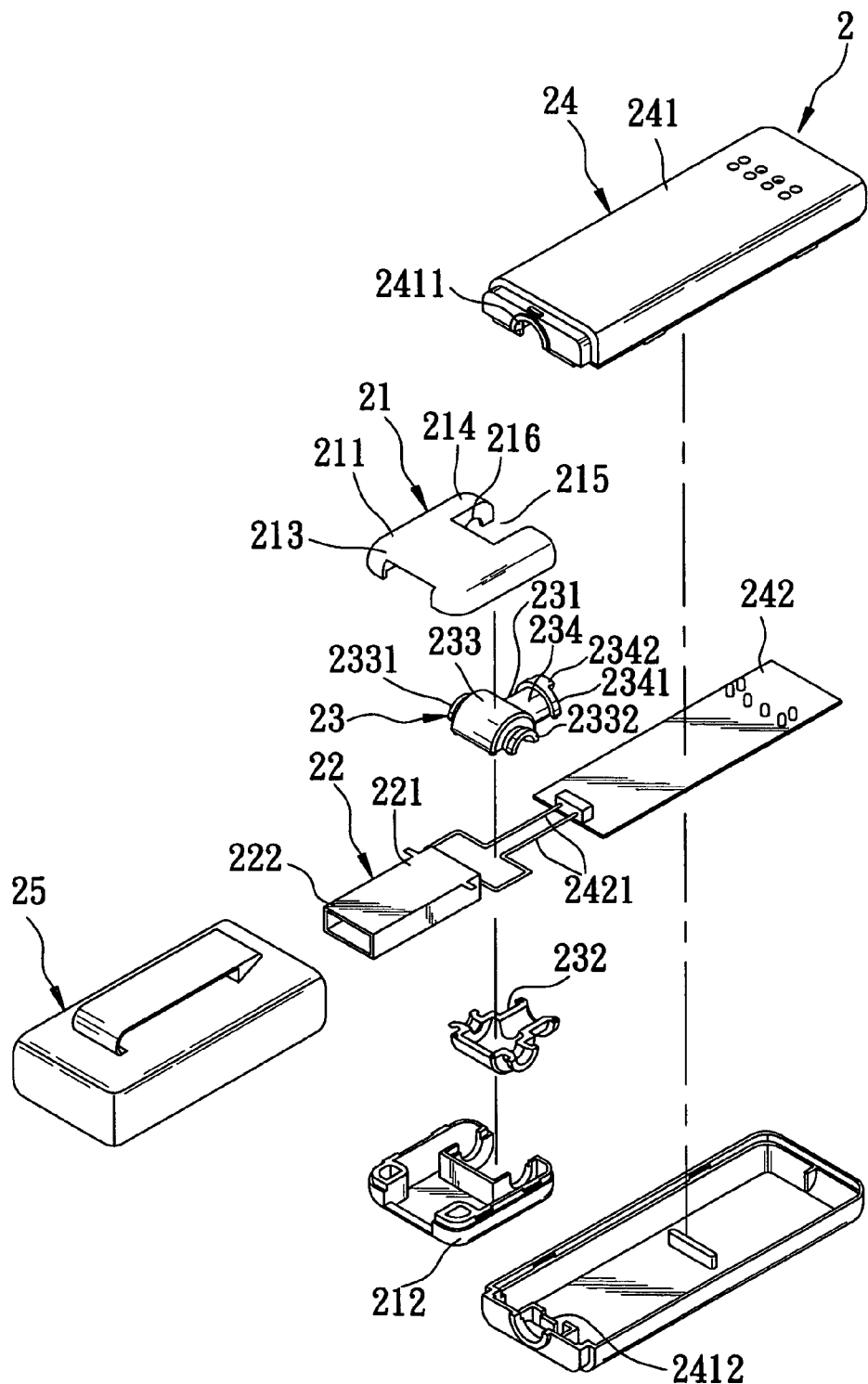
FIG. 2 is an exploded perspective view of the conventional wireless transceiver device of FIG. 1.
Figure 3:
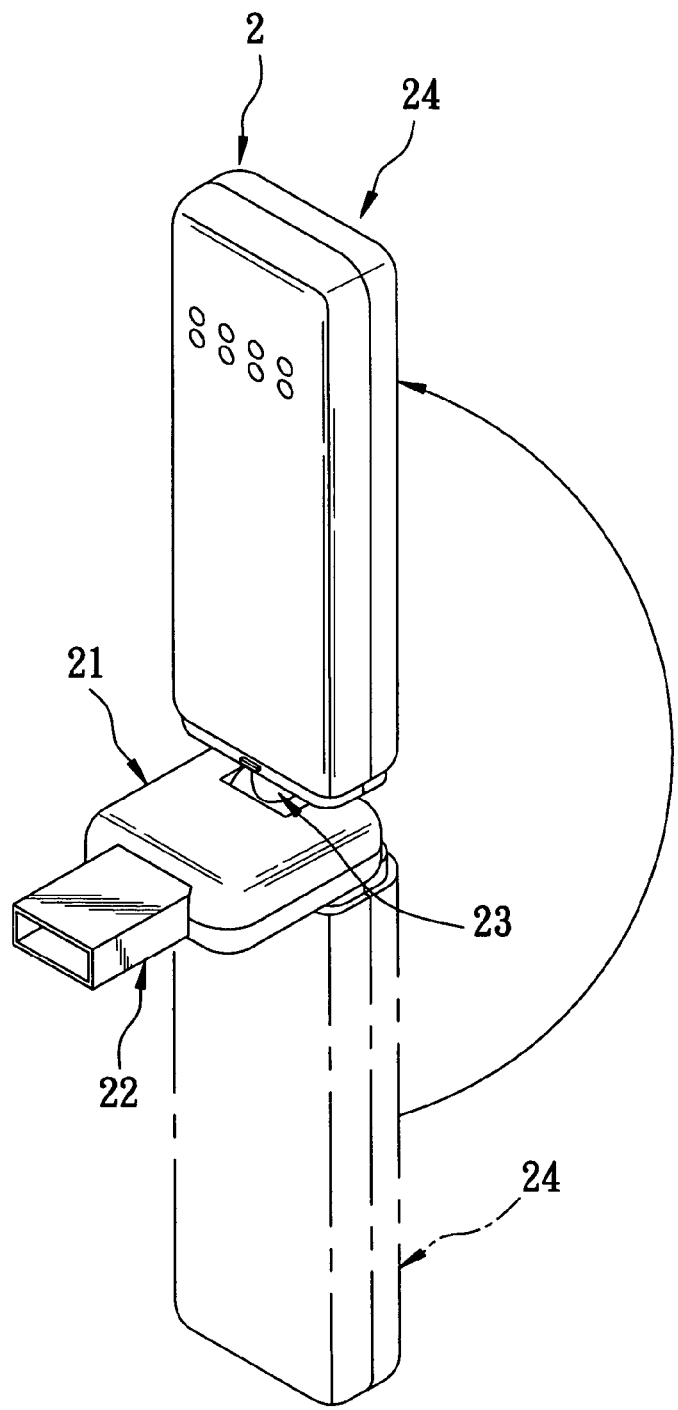
FIG. 3 is a perspective view to illustrate how a wireless transceiver module and a pivot module are adjusted relative to a connector module of the conventional wireless transceiver device of FIG. 1.
Figure 4:
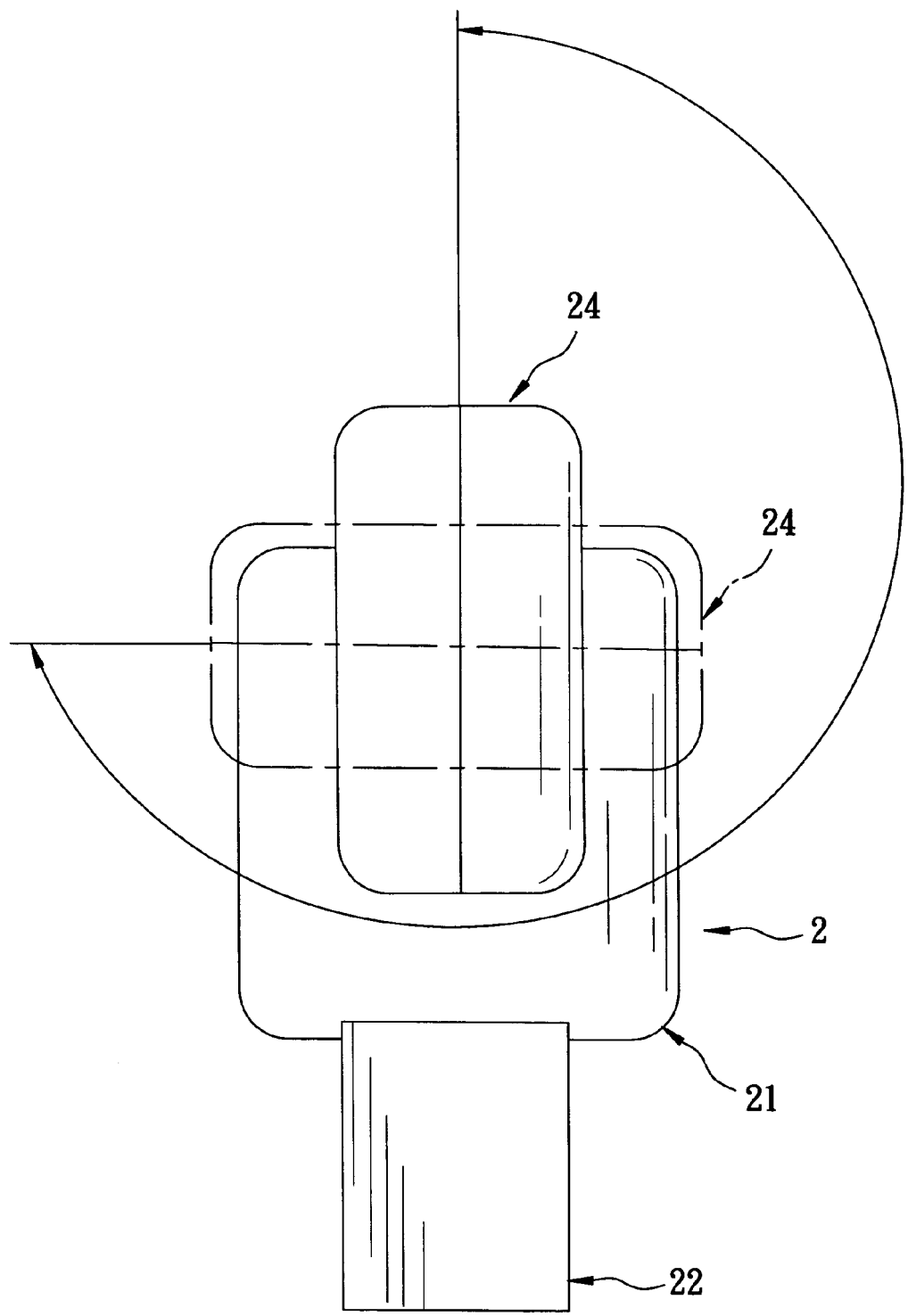
FIG. 4 is a schematic view to illustrate how the wireless transceiver module is adjusted relative to the pivot module in the conventional wireless transceiver device of FIG. 1.
Figure 5:
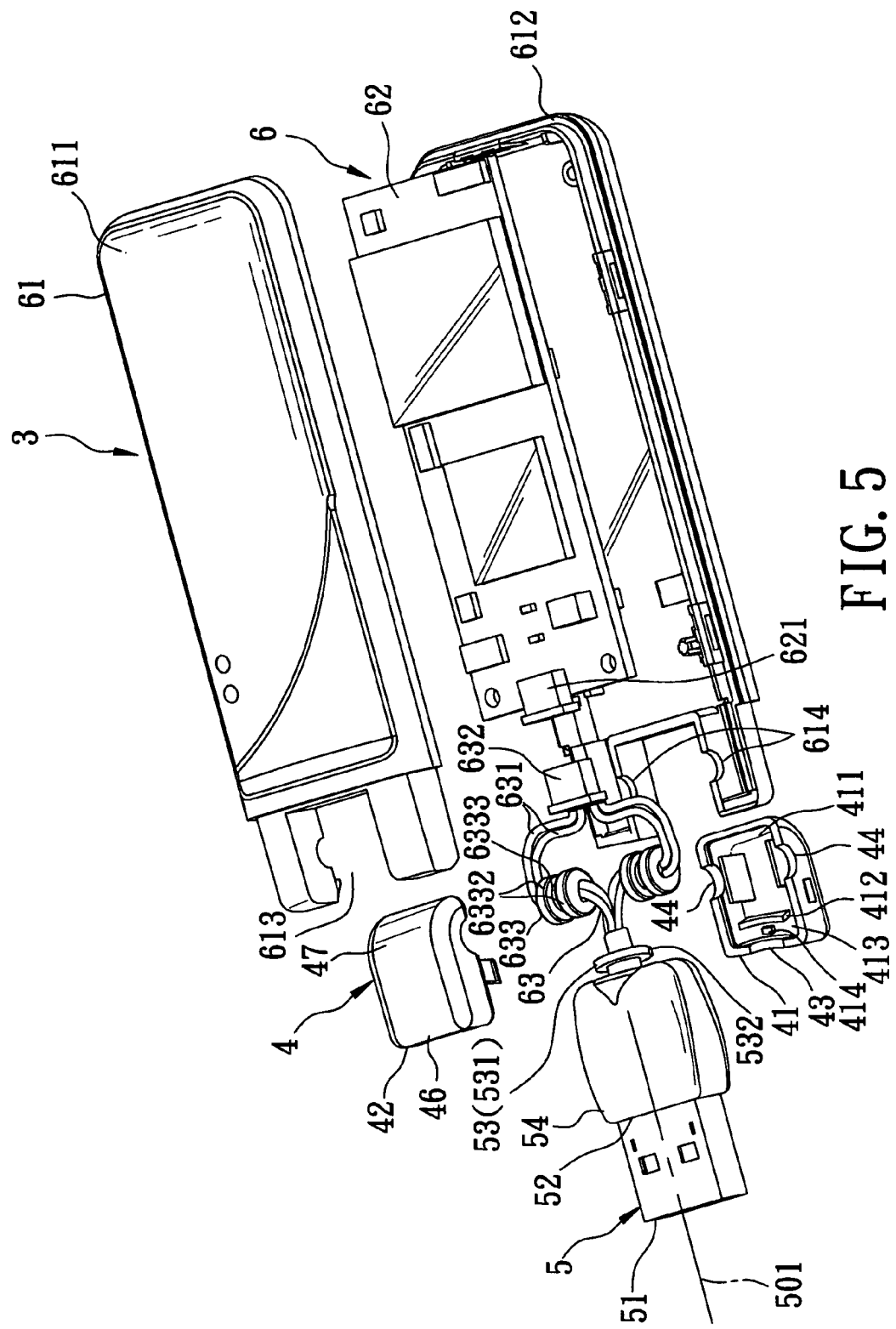
FIG. 5 is an exploded perspective view of a preferred embodiment of a wireless transceiver device according to the present invention.
Figure 6:
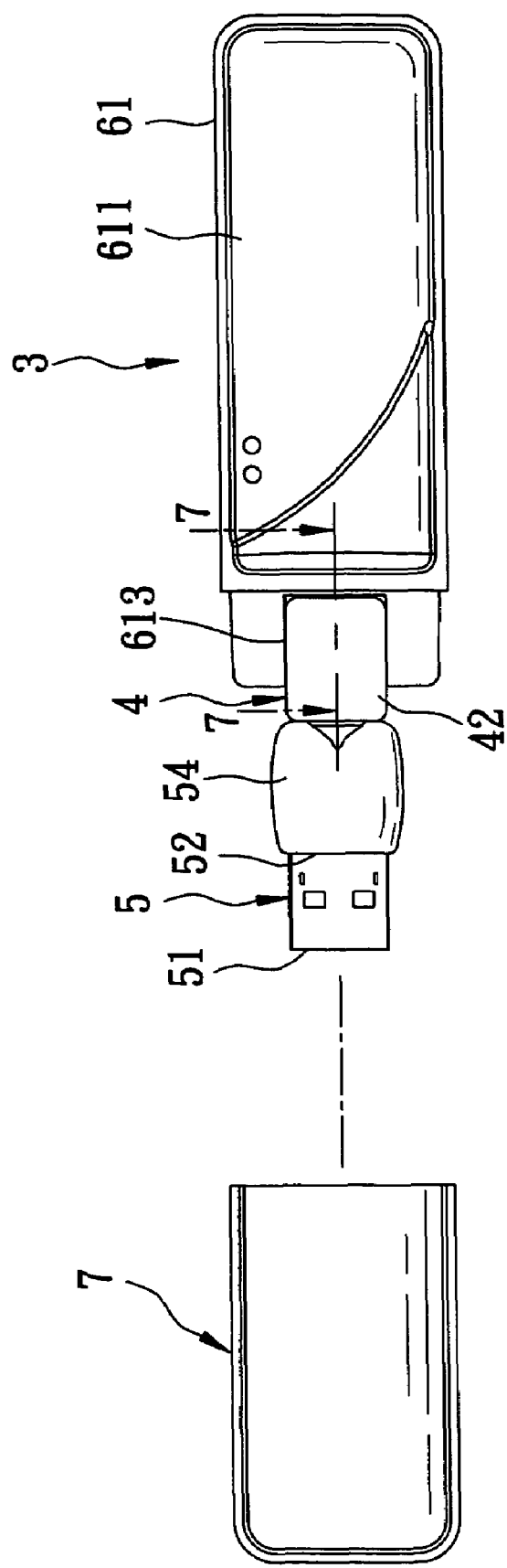
FIG. 6 is a top schematic view of the preferred embodiment.
Figure 7:
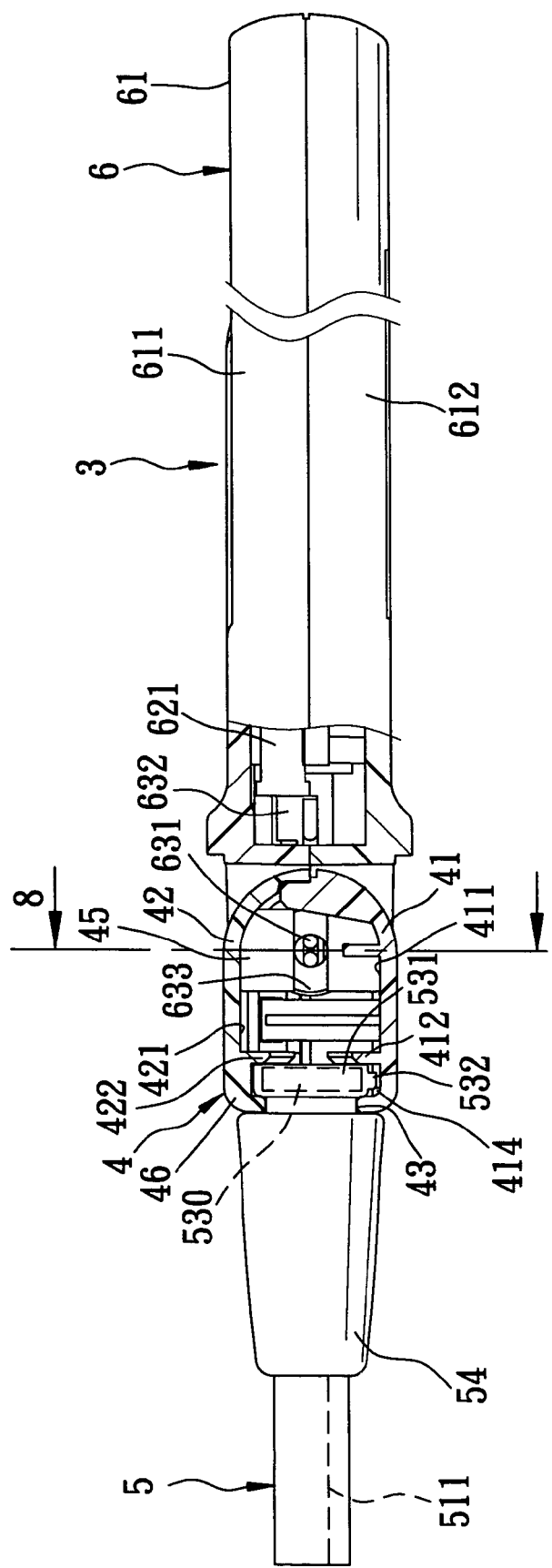
FIG. 7 is a side, schematic, partly sectional view of the preferred embodiment, taken along line 7—7 in FIG. 6.

As shown in FIGS. 5 and 6, a preferred embodiment of a wireless transceiver device 3 according to the present invention comprises a connector module 5, a hollow coupling base 4, a wireless transceiver module 6, and a cover 7 for covering the connector module 5. The connector module 5 has a connecting section 51 that is provided with electrical connector means 511 (see FIG. 7) adapted for connecting electrically and removably with a socket (not shown) of an external electronic device, such as the host computer shown in FIG. 1, and a coupling section 52 that is opposite to the connecting section 51 in a first direction and that is formed with a first pivot part 53 extending along a first pivot axis 501 parallel to the first direction and away from the connecting section 51. Preferably, the electrical connector means 511 includes a known universal serial bus (USB) connector. In this embodiment, the first pivot part 53 is formed as an injection-molded sheath 54 that encapsulates the coupling section 52. The first pivot part 53 includes an anti-friction member 530, such as a bushing, in the sheath 54, as best shown in FIG. 7. In view of the anti-friction member 530, the first pivot part 53 is configured with an annular stop flange 531 that extends in radial outward directions with respect to the first pivot axis 501. The first pivot part 53 is further formed with a first limit member 532 that projects from the stop flange 531 in a radial outward direction with respect to the first pivot axis 501.

Figure 8:
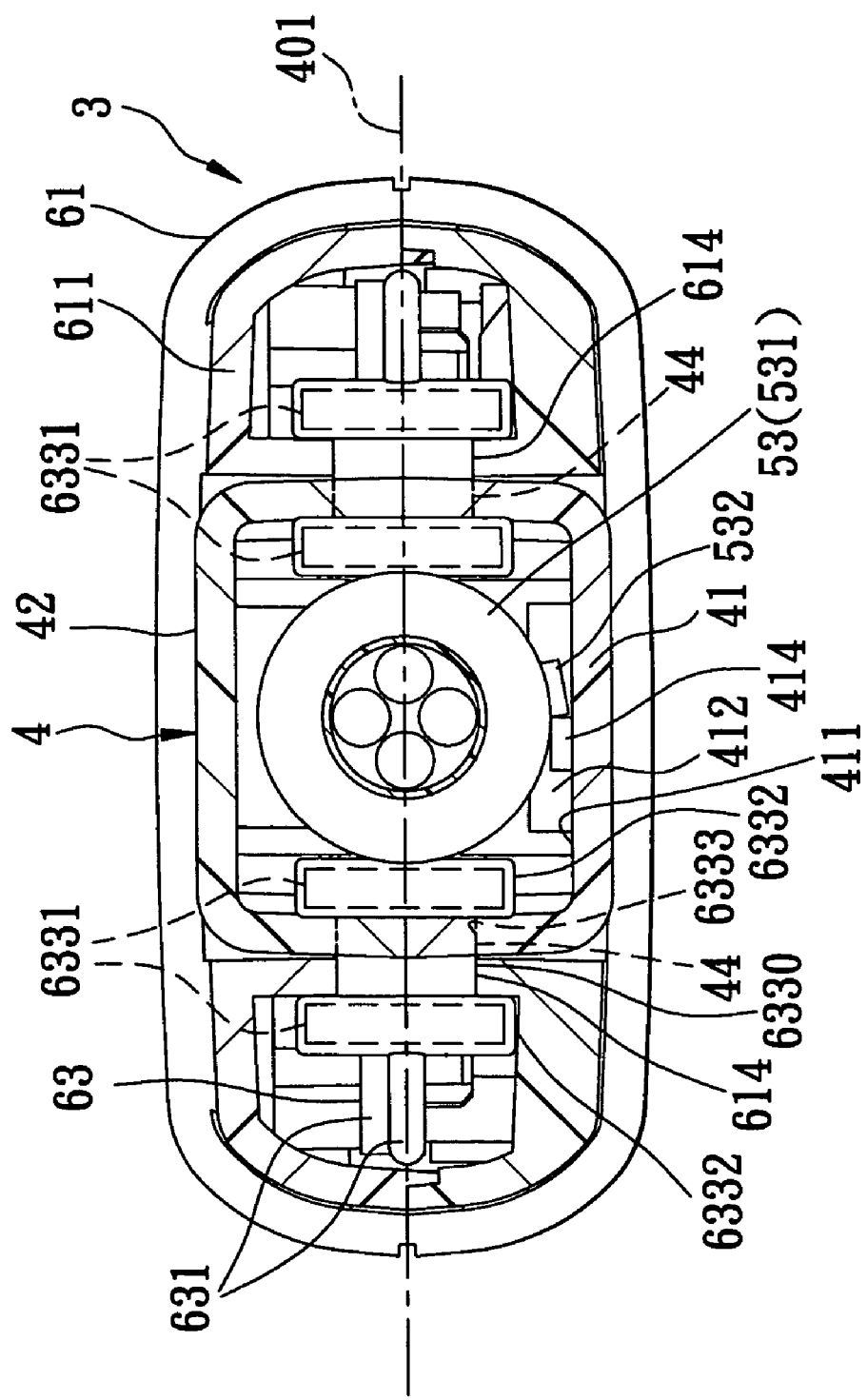
FIG. 8 is a side, schematic, sectional view of the preferred embodiment, taken along line 8—8 in FIG. 7.
Figure 10:
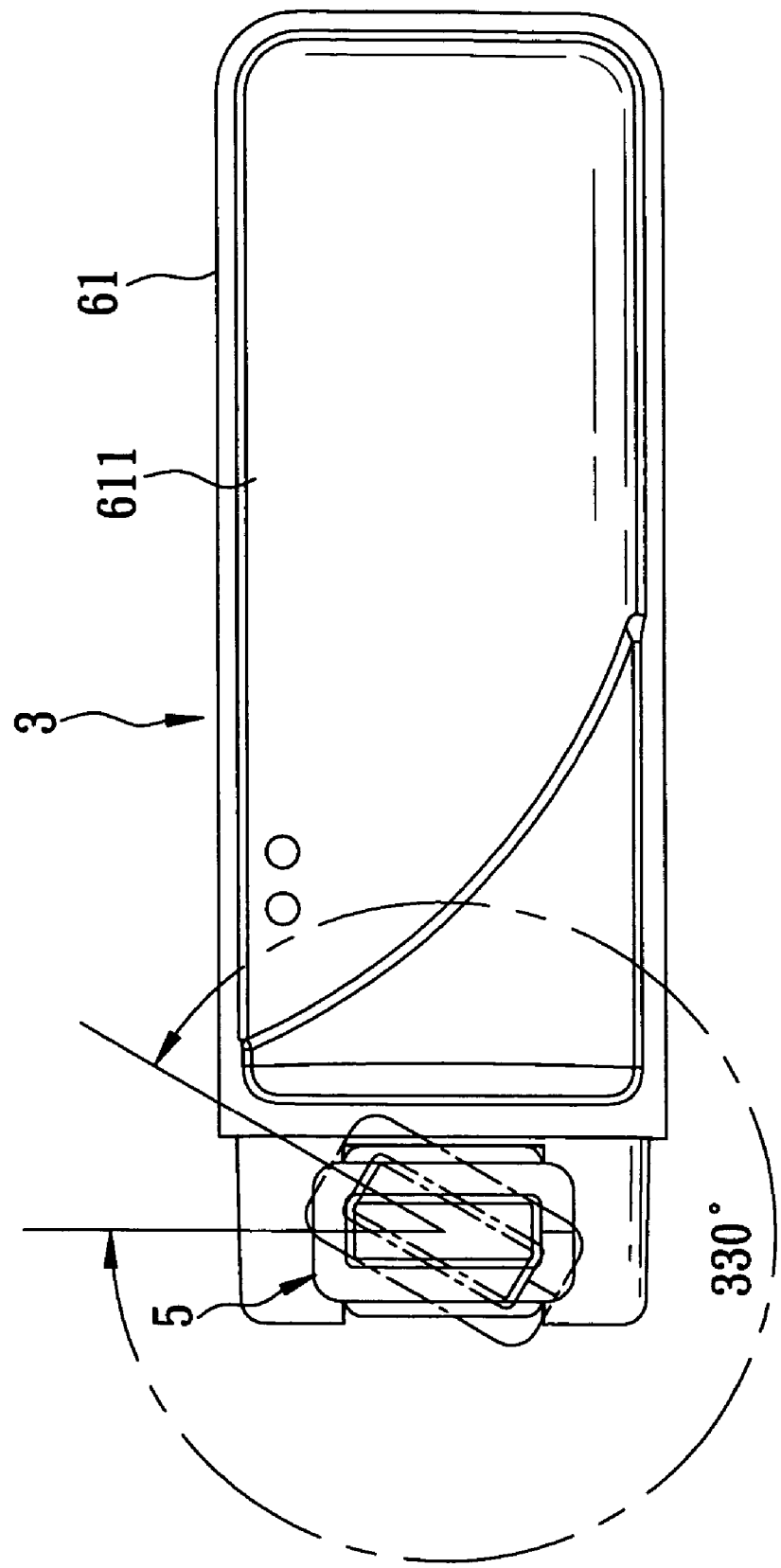
FIG. 10 is a schematic view to illustrate how the connector module is adjusted relative to the coupling base and the wireless transceiver module about another pivot axis in the preferred embodiment of this invention.

Referring to FIGS. 5, 7 and 8, the coupling base 4 includes first and second shell portions 41, 42 that are coupled together to define a receiving space 45, and has a first end part 46 formed with a first pivot hole 43 that extends in the first direction and that engages rotatably the first pivot part 53 to permit relative rotation between the coupling base 4 and the connector module 5 about the first pivot axis 501. The coupling base 4 further has a second end part 47 formed with a pair of second pivot holes 44 that are spaced apart from the first pivot hole 43 in the first direction and that are aligned in a second direction transverse to the first direction. In this embodiment, each of the first and shell portions 41, 42 of the coupling base 4 has a space-confining side 411, 421 formed with a barrier projection 412, 422 proximate to the first pivot hole 43. A flange retaining space 413 is thus formed on one side of the barrier projections 412, 422 facing the first pivot hole 43. A second limit member 414 projects from the space-confining side 411 of the first shell portion 41, and is disposed in the flange retaining space 413. When the stop flange 531 is confined rotatably in the flange retaining space 413, the connector module 5 is coupled rotatably to the coupling base 4. Preferably, the first and second limit members 532, 414 have dimensions such that the second limit member 414 cooperates with the first limit member 532 to limit extent of relative rotation between the coupling base 4 and the connector module 5 about the first pivot axis 501 within a 330-degree range, as best shown in FIG. 10.

As shown in FIGS. 5, 7, and 8, the wireless transceiver module 6 includes a casing 61, a transceiver circuit 62, and a wire unit 63.

The casing 61 includes first and second casing parts 611, 612 that are coupled together, and is formed with a notched section 613 to receive the second end part 47 of the coupling base 4. The notched section 613 is formed with a pair of third pivot holes 614, each of which is aligned with a respective one of the second pivot holes 44.

The transceiver circuit 62 is disposed in the casing 61, and provides a function for wireless transmission and reception of data to and from the external electrical device. Since the specific construction of the transceiver circuit 62 is known in the art, it will not be detailed herein for the sake of brevity.

The wire unit 63 includes a plurality of flexible wires 631. The flexible wires 631 have first ends terminated by a connector 632 for mating electrically and removably with a complementary connector 621 of the transceiver circuit 62, thereby establishing electrical connection between the wires 631 and the transceiver circuit 62. The wires 631 further have second ends that extend out of the casing 61 at one of the third pivot holes 614, that extend through one of the second pivot holes 44 and through the first pivot hole 43 of the coupling base 4, and that are connected electrically to the connector module 5. The wire unit 63 further includes a pair of second pivot parts 633, each of which is pivotally retained at a respective aligned pair of the second and third pivot holes 44, 614 and permits extension of a corresponding set of the wires 631 therethrough, thereby permitting relative rotation between the wireless transceiver module 6 and the coupling base 4 about a second pivot axis 401 (see FIGS. 8 and 9) transverse to the first pivot axis 501 and parallel to the second direction.

Figure 9:
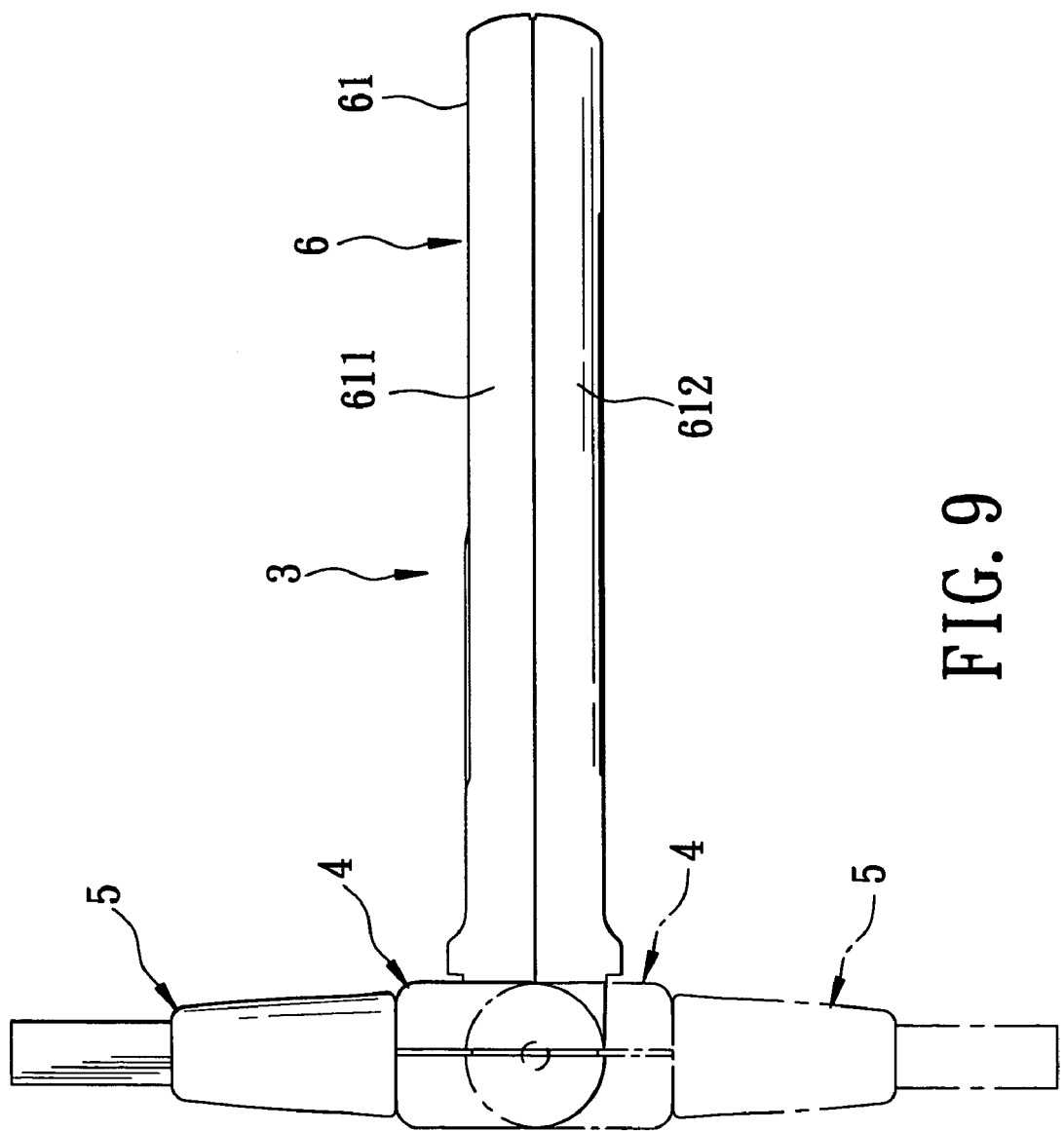
FIG. 9 is a schematic view to illustrate how a connector module and a coupling base are adjusted relative to a wireless transceiver module about a pivot axis in the preferred embodiment of this invention.

In this embodiment, each of the second pivot parts 633 includes a pair of spaced apart anti-friction members 6331, such as bushings, that permit extension of the corresponding set of the wires 631 therethrough, and a sheath 6330 that encloses the anti-friction members 6331. The construction as such configures each of the second pivot parts 633 with a pair of stop rings 6332, each of which is confined rotatably by a respective one of the casing 61 and the coupling base 4, and a restricted tube segment 6333 that extends between the stop rings 6332 and that extends in the respective aligned pair of the second and third pivot holes 44, 614. In this embodiment, the wireless transceiver module 6 is permitted to pivot about the second pivot axis 401 within a 180-degree range, as best shown in FIG. 9.

In the wireless transceiver device 3 of this invention, because the connector module 5 is formed with the first pivot part 53, the wireless transceiver module 6 is rotatable about two pivot axes relative to the connector module 5 when the coupling base 4 is assembled to the casing 61 and the first pivot part 53, thereby resulting in fewer assembly steps to facilitate mass production as compared to the conventional wireless transceiver device 2 described beforehand. In addition, due to the anti-friction members 530, 6331, direct contact of the flexible wires 631 with the coupling base 4 during adjustment of the wireless transceiver module 6 can be prevented, thereby subjecting the flexible wires 631 to minimal friction forces during adjustment of the wireless transceiver module 6, which results in a longer service life for the wires 631.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A rotatable wireless transceiver device, comprising:
   a connector module having a connecting section that is provided with electrical connector means adapted for connecting electrically with an external electronic device, and a coupling section that is opposite to said connecting section in a first direction and that is formed with a first pivot part extending along a first pivot axis parallel to the first direction and away from said connecting section, said first pivot part being formed with a first limit member;
   a hollow coupling base having a first end part formed with a first pivot hole that extends in the first direction and that engages rotatably said first pivot part to permit relative rotation between said coupling base and said connector module with respect to the first pivot axis, said coupling base further having a second end part formed with a pair of second pivot holes that are spaced apart from said first pivot hole in the first direction and that are aligned in a second direction transverse to the first direction, said coupling base further having a second limit member that cooperates with said first limit member to limit extent of relative rotation between said coupling base and said connector module with respect to the first pivot axis; and
   a wireless transceiver module including
      a casing formed with a notched section to receive said second end part of said coupling base, said notched section being formed with a pair of third pivot holes, each of which is aligned with a respective one of said second pivot holes,
      a transceiver circuit disposed in said casing, and
      a wire unit including a plurality of flexible wires, each of which has a first end that is connected electrically to said transceiver circuit and a second end that extends out of said casing at one of said third pivot holes, that extends through one of said second pivot holes and through said first pivot hole of said coupling base, and that is connected electrically to said connector module, said wire unit further including a pair of second pivot parts, each of which is pivotally retained at a respective aligned pair of said second and third pivot holes and permits extension of a corresponding set of said flexible wires therethrough, thereby permitting relative rotation between said wireless transceiver module and said coupling base with respect to a second pivot axis transverse to the first pivot axis and parallel to the second direction.

2. The rotatable wireless transceiver device as claimed in claim 1, wherein said first pivot part is formed as an injection-molded sheath that encapsulates said coupling section, said second ends of said flexible wires of said wire unit extending through said first pivot part along the first direction.

3. The rotatable wireless transceiver device as claimed in claim 2, wherein said first pivot part includes an anti-friction member in said sheath, said anti-friction member permitting said second ends of said flexible wires of said wire unit to extend therethrough, and preventing direct contact between said sheath and said flexible wires of said wire unit.

4. The rotatable wireless transceiver device as claimed in claim 1, wherein each of said second pivot parts includes a pair of anti-friction members that permit extension of the corresponding set of said flexible wires therethrough, and a sheath that encloses said anti-friction members.

5. The rotatable wireless transceiver device as claimed in claim 1, wherein said second limit member cooperates with said first limit member to limit relative rotation between said coupling base and said connector module with respect to the first pivot axis within a 330-degree range.

6. The rotatable wireless transceiver device as claimed in claim 1, wherein said electrical connector means includes a universal serial bus connector.

7. The rotatable wireless transceiver device as claimed in claim 1, further comprising a cover for covering said connector module.

* * * * *